United States Patent
Sasaki

(10) Patent No.: US 8,006,640 B2
(45) Date of Patent: Aug. 30, 2011

(54) PLASMA PROCESSING APPARATUS AND PLASMA PROCESSING METHOD

(75) Inventor: Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1159 days.

(21) Appl. No.: 11/691,154

(22) Filed: Mar. 26, 2007

(65) Prior Publication Data

US 2007/0221294 A1 Sep. 27, 2007

(30) Foreign Application Priority Data

Mar. 27, 2006 (JP) .................................. 2006-085380

(51) Int. Cl.
*C23C 16/511* (2006.01)

(52) U.S. Cl. ...... 118/723 AN; 118/723 R; 118/723 ME; 118/723 MW; 156/345.41; 156/345.36

(58) Field of Classification Search .......... 118/723 MW, 118/723 AN, 723 R, 723 ME, 723 MR; 438/772, 438/777; 156/345.41, 345.36; 343/767, 343/770, 771

See application file for complete search history.

(56) References Cited

U.S. PATENT DOCUMENTS

| | | | |
|---|---|---|---|
| 5,478,403 A | 12/1995 | Shinagawa et al. | |
| 6,091,045 A * | 7/2000 | Mabuchi et al. | 219/121.43 |
| 6,388,632 B1 * | 5/2002 | Murakawa et al. | 343/770 |
| 6,470,824 B2 * | 10/2002 | Kawakami et al. | 118/723 AN |
| 6,953,908 B2 * | 10/2005 | Ishii et al. | 219/121.43 |
| 6,987,056 B2 * | 1/2006 | Lim et al. | 438/585 |
| 7,098,147 B2 * | 8/2006 | Nansei et al. | 438/769 |
| 2002/0022375 A1 | 2/2002 | Kwon | |
| 2004/0094094 A1 * | 5/2004 | Ohmi et al. | 118/723 MW |
| 2004/0250771 A1 * | 12/2004 | Ozaki et al. | 118/723 MW |

FOREIGN PATENT DOCUMENTS

| | | |
|---|---|---|
| JP | 2000-260767 | 9/2000 |
| JP | 2002-299240 | 10/2002 |
| JP | 2003-59919 | 2/2003 |
| JP | 2003-115587 | 4/2003 |
| KR | 1993-0004115 | 5/1993 |
| KR | 2002-0011022 | 2/2002 |

* cited by examiner

*Primary Examiner* — Julio J Maldonado
(74) *Attorney, Agent, or Firm* — Oblon, Spivak, McClelland, Maier & Neustadt, L.L.P.

(57) ABSTRACT

A plasma processing apparatus includes: a process container configured to accommodate a target object and hold a vacuum therein for performing a plasma process; a worktable configured to place the target object thereon inside the process container; a planar antenna including a plurality of slots and configured to supply microwaves into the process container; a gas feed mechanism configured to supply a process gas into the process container; and a top plate disposed opposite the worktable, the top plate being set at a position separated from the target object placed on the worktable by a distance of 20 mm or more and 100 mm or less.

9 Claims, 7 Drawing Sheets

PLASMA PROCESSING APPARATUS AND PLASMA PROCESSING METHOD

BACKGROUND OF THE INVENTION

1. Field of the Invention

The present invention relates to a plasma processing apparatus and plasma processing method for forming a silicon oxide film or silicon nitride film by processing a target object, such as a semiconductor substrate, by use of plasma.

2. Description of the Related Art

In the process of manufacturing various semiconductor devices, silicon oxide films and/or silicon nitride films are formed for use in various applications, such as gate insulating films in transistors. As a method for forming a silicon oxide film or silicon nitride film, there is a thermal oxidation process or thermal nitridation process. In addition, since it is required in recent years to decrease the temperature and thermal budget used in manufacturing semiconductor devices, there is proposed a method for performing an oxidation process or nitridation process on silicon by use of plasma to form a silicon oxide film or silicon nitride film (for example, Jpn. Pat. Appln. KOKAI Publications No. 2000-260767 and No. 2003-115587).

As a phenomenon peculiar to a plasma process for performing an oxidation process or nitridation process on silicon by use of plasma, the micro-loading effect may become prominent. Consequently, within a pattern including non-dense and dense portions and/or a pattern including different aspect ratios of trenches (the ratio of the depth of a trench relative to the width thereof) formed on a target object, a difference may be brought about in the thickness of an oxide film or nitride film between a non-dense portion or low aspect ratio portion and a dense portion or high aspect ratio portion (which will be collectively referred to as "non-dense and dense difference" hereinafter, as needed). In this case, the film thickness is smaller at a dense portion or high aspect ratio portion than at a non-dense portion or low aspect ratio portion, and the performance of semiconductor devices is thereby adversely affected, such that the leakage current increases, for example. Accordingly, it is necessary to solve this problem to prevent the reliability of semiconductor devices from being deteriorated.

BRIEF SUMMARY OF THE INVENTION

An object of the present invention is to provide a plasma processing apparatus and plasma processing method for forming a oxide film or nitride film by a plasma process, while suppressing the non-dense and dense difference in film thickness.

According to a first aspect of the present invention, there is provided a plasma processing apparatus comprising: a process container configured to accommodate a target object and hold a vacuum therein for performing a plasma process; a worktable configured to place the target object thereon inside the process container; a planar antenna including a plurality of slots and configured to supply microwaves into the process container; a gas feed mechanism configured to supply a process gas into the process container; and a top plate disposed opposite the worktable, the top plate being set at a position separated from the target object placed on the worktable by a distance of 20 mm or more and 100 mm or less.

The top plate is preferably set at a position separated from the target object by a distance of 20 mm or more and 80 mm or less.

According to a second aspect of the present invention, there is provided a plasma processing method comprising: preparing a plasma processing apparatus comprising a process container configured to accommodate a target object and hold a vacuum therein for performing a plasma process, a worktable configured to place the target object thereon inside the process container, a planar antenna including a plurality of slots and configured to supply microwaves into the process container, a gas feed mechanism configured to supply a process gas into the process container, and a top plate disposed opposite the worktable, the top plate being set at a position separated from the target object placed on the worktable by a distance of 20 mm or more and 100 mm or less; placing the target object on the worktable; supplying the process gas into the process container; supplying microwaves into the process container, thereby generating plasma having an electron temperature of 1.2 eV or less; and performing a plasma process on the target object by use of the plasma.

This plasma process may be arranged to supply oxygen-containing plasma to a silicon surface of the target object to perform a silicon plasma oxidation process, which is exemplified by an oxidation process applied to a sidewall of a poly-crystalline silicon layer of a gate electrode. The process gas may contain at least a rare gas, oxygen gas, and hydrogen gas. The plasma process is preferably arranged to use a gas pressure of 1.33 to 133.33 Pa, and more preferably of 1.33 to 66.66 Pa, inside the process container. The top plate of the plasma processing apparatus is preferably set at a position separated from the target object by a distance of 20 mm or more and 80 mm or less.

According to a third aspect of the present invention, there is provided a storage medium that stores a program for execution on a computer to control a plasma processing apparatus, the program, when executed by the computer, controlling the plasma processing apparatus to perform a plasma processing method, wherein the apparatus comprises a process container configured to accommodate a target object and hold a vacuum therein for performing a plasma process, a worktable configured to place the target object thereon inside the process container, a planar antenna including a plurality of slots and configured to supply microwaves into the process container, a gas feed mechanism configured to supply a process gas into the process container, and a top plate disposed opposite the worktable, the top plate being set at a position separated from the target object placed on the worktable by a distance of 20 mm or more and 100 mm or less, and wherein the plasma processing method comprises placing the target object on the worktable, supplying the process gas into the process container, supplying microwaves into the process container, thereby generating plasma having an electron temperature of 1.2 eV or less, and performing a plasma process on the target object by use of the plasma.

According to a fourth aspect of the present invention, there is provided a plasma processing apparatus for performing a plasma process on a target object, the apparatus comprising: a process container configured to accommodate the target object and hold a vacuum therein for performing the plasma process; a worktable configured to place the target object thereon inside the process container; a planar antenna including a plurality of slots and configured to supply microwaves into the process container; a gas feed mechanism configured to supply a process gas into the process container; a top plate disposed above and opposite the worktable, and set at a position separated from the target object placed on the worktable by a distance of 20 mm or more and 100 mm or less; and a control section configured to control the apparatus to generate microwave-excited plasma with a high density inside the process container and perform the plasma process at a process pressure of 1.33 Pa to 66.66 Pa.

DETAILED DESCRIPTION OF THE INVENTION

Embodiments of the present invention will now be described with reference to the accompanying drawings.

Figure 1:
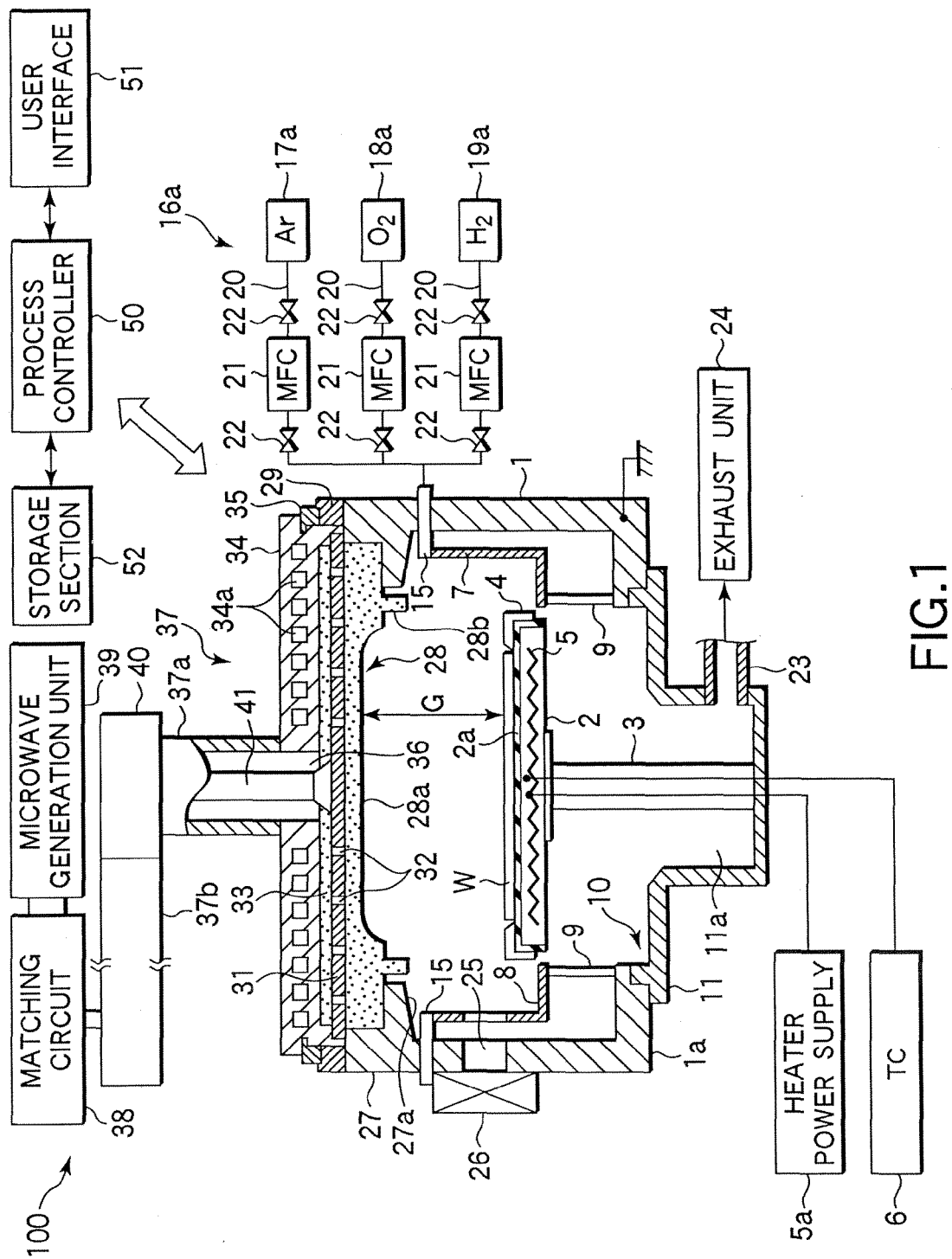
FIG. 1 is a sectional view schematically showing a plasma oxidation processing apparatus according to an embodiment of the present invention.

FIG. 1 is a sectional view schematically showing an example of a plasma oxidation processing apparatus suitable for performing a plasma oxidation processing method according to the present invention. This plasma oxidation processing apparatus 100 is arranged as a microwave plasma oxidation processing apparatus of the RLSA type, in which microwaves are supplied from a planar antenna having a plurality of slots, such as an RLSA (Radial Line Slot Antenna), into a process chamber to generate plasma, so that microwave-excited plasma is generated with a high density and a low electron temperature. This apparatus can perform a process by use of plasma having a plasma density of $1 \times 10^{10}$ to $5 \times 10^{12}/cm^3$ and a low electron temperature of 0.7 to 2 eV.

Accordingly, the plasma oxidation processing apparatus 100 is suitably usable for forming a silicon oxide film or the like in the process of manufacturing various semiconductor devices.

This plasma oxidation processing apparatus 100 includes an essentially cylindrical chamber 1, which is airtight and grounded. The bottom wall 1a of the chamber 1 has a circular opening portion 10 formed essentially at the center, and is provided with an exhaust chamber 11 communicating with the opening portion 10 and protruding downward.

The chamber 1 is provided with a worktable 2 located therein and made of a ceramic, such as AlN, for supporting a target substrate, such as a silicon wafer W (which will be simply referred to as "wafer" hereinafter) in a horizontal state. The worktable 2 is supported by a cylindrical support member 3 made of a ceramic, such as AlN, and extending upward from the center of the bottom of the exhaust chamber 11. The worktable 2 is covered with a susceptor cover 2a made of, e.g., quartz to prevent particles from being generated from AlN or the like. The worktable 2 is provided with a guide ring 4 located on the outer edge to guide the wafer W.

The worktable 2 is provided with a heater 5 of the resistance heating type built therein. The heater 5 is supplied with a power from a heater power supply 5a to heat the worktable 2, thereby heating the target object or wafer W. A thermo couple (TC) 6 is disposed in the worktable 2, so that the heating temperature for the wafer W can be controlled within a range of from about room temperature to 900° C. The worktable 2 is further provided with wafer support pins (not shown) that can project and retreat relative to the surface of the worktable 2 to support the wafer W and move it up and down.

A cylindrical liner 7 made of quartz is attached along the inner wall of the chamber 1 to prevent metal contamination due to the material of the chamber. The outer periphery of the worktable 2 is surrounded by an annular baffle plate 8 made of quartz and supported by a plurality of struts 9. The baffle plate 8 has a number of exhaust holes (not shown) that allow the interior of the chamber 1 to be uniformly exhausted.

A gas feed member 15 having an annular structure is attached in the sidewall of the chamber 1, and is connected to a gas supply system 16a to form a gas feed mechanism. The gas feed member may have a nozzle structure or shower structure. The gas supply system 16a includes an Ar gas supply source 17a, an $O_2$ gas supply source 18a, and an $H_2$ gas supply source 19a, from which Ar gas, $O_2$ gas, and $H_2$ gas are supplied through respective gas lines 20 to the gas feed member 15 and are delivered from the gas feed member 15 into the chamber 1. Each of the gas lines 20 is provided with a mass-flow controller 21 and two switching valves 22 one on either side of the controller 21. In place of Ar gas, another rare gas, such as Kr gas, Xe gas, or He gas, may be used.

The sidewall of the exhaust chamber 11 is connected to an exhaust unit 24 including a high speed vacuum pump through an exhaust line 23. The exhaust unit 24 can be operated to uniformly exhaust gas from inside the chamber 1 through the baffle plate 8 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W is transferred between the plasma oxidation processing apparatus 100 and an adjacent transfer chamber (not shown) through the transfer port 25.

The top of the chamber 1 is opened and is joined to an annular upper plate 27. The upper plate 27 has an annular support portion 27a formed thereon along the inner periphery of a lower portion and extending toward the space inside the chamber. A transmission plate 28 made of a dielectric material, such as quartz or a ceramic, e.g., $Al_2O_3$ or AlN to transmit microwaves is airtightly mounted on the support portion 27a through a seal member (described later). The interior of the chamber 1 is thus held airtight.

The transmission plate 28 is disposed opposite the worktable 2 and serves as a top plate that defines the upper end of the plasma processing space formed between the worktable 2 and transmission plate 28. The transmission plate 28 has a dished recess 28a formed in the central portion of the bottom (the face opposite the wafer W) to control diffusion of microwaves being transmitted so as to uniformize plasma. The thickness of the thin portion of the transmission plate 28 is preferably set to be $\lambda g/4$ or more in light of generation of standing waves and the strength of the transmission plate 28.

The transmission plate 28 has a peripheral projecting portion 28b formed thereon in an annular direction at the periphery and vertically extending downward. The peripheral projecting portion 28b is formed to cover the support portion 27a of the upper plate 27. The upper plate 27 is formed of a metal member of, e.g., an Al alloy, and the support portion 27a is exposed to the plasma generation space. Accordingly, the peripheral projecting portion 28b is disposed to cover and protect the support portion 27a to prevent plasma from sputtering the support portion 27a and thereby causing contamination with metals, such as Al. The peripheral projecting portion 28b is preferably located close to the upper plate 27 by a distance with which no plasma is generated. For example, this distance is preferably set to be 10 mm or less and more preferably to be 1 mm or less.

The support portion 27a extending inward inside the chamber 1 allows the microwave feed area of the transmission plate 28 to be a required minimum size that is larger than the wafer and almost the same as the worktable 2. At the same time, this support portion 27a allows the interior of the chamber 1 to be as large as possible in the horizontal direction. Consequently, it is possible to generate plasma uniformly relative to the substrate so as to uniformly perform a plasma process. The extending length of the support portion 27a is preferably set to be 20 mm or more.

The transmission plate 28 may be formed to have a flat bottom face.

A circular planar antenna member 31 is located above the transmission plate 28. The planar antenna member 31 is fixed to the upper end of the sidewall of the chamber 1. The planar antenna member 31 is formed of a conductive body, such as a copper plate or aluminum plate with the surface plated with gold or silver. The planar antenna member 31 has a number of slot-like microwave radiation holes 32 formed therethrough and arrayed in a predetermined pattern, for radiating microwaves.

Figure 2:
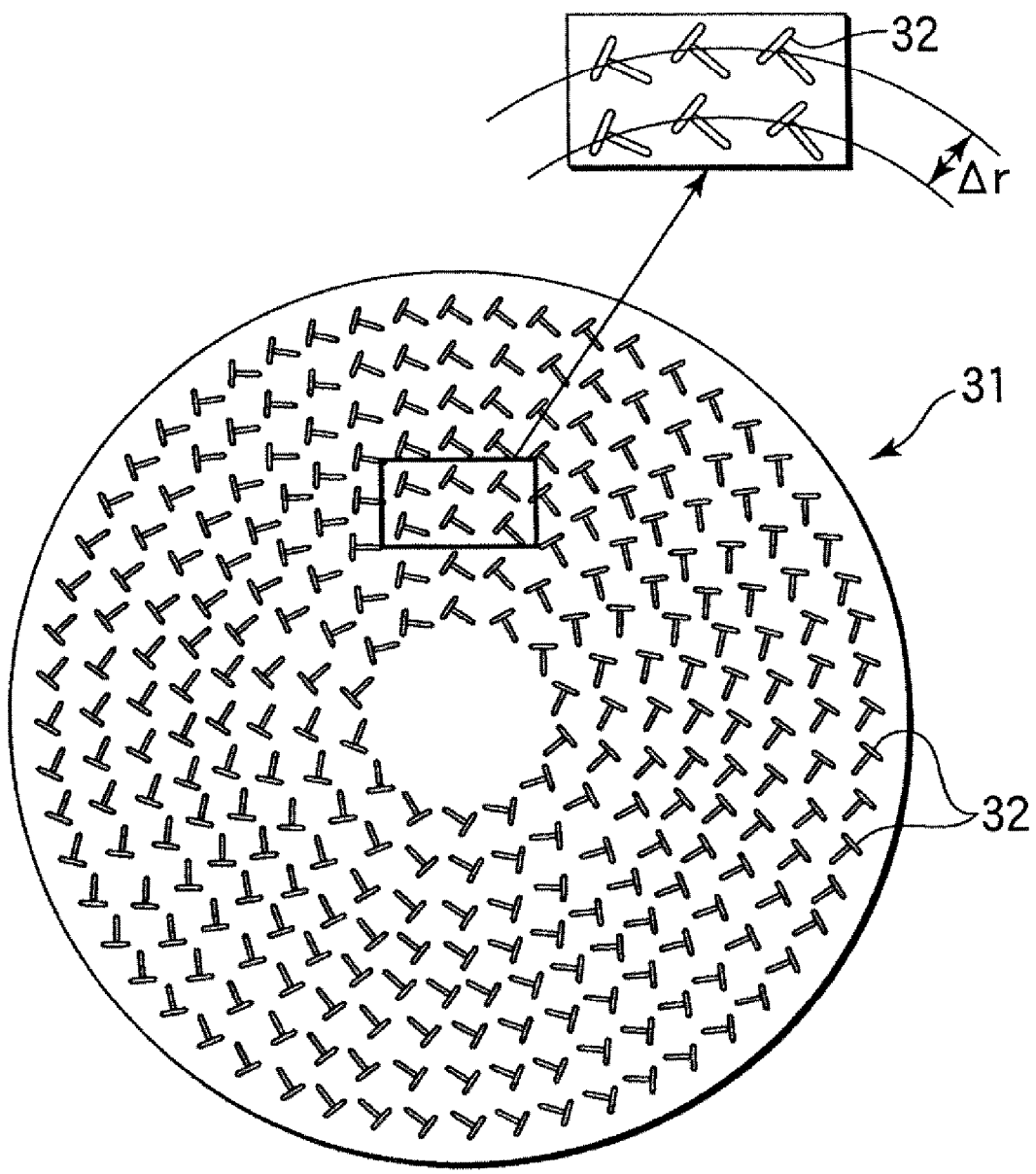
FIG. 2 is a view showing the structure of a planar antenna member.

For example, as shown in FIG. 2, the microwave radiation holes 32 are formed of long slits, wherein the microwave radiation holes 32 are typically arranged such that adjacent holes 32 form a T-shape, and the microwave radiation holes 32 are arrayed on a plurality of concentric circles. The length and array intervals of the microwave radiation holes 32 are determined in accordance with the wavelength ($\lambda$g) of microwaves. For example, the intervals of the microwave radiation holes 32 are set to be $\lambda$g/4, $\lambda$g/2, or $\lambda$g. In FIG. 2, the interval between adjacent microwave radiation holes 32 respectively on two concentric circles is expressed with $\Delta$r. The microwave radiation holes 32 may have another shape, such as a circular shape or arc shape. The array pattern of the microwave radiation holes 32 is not limited to a specific one, and, for example, it may be spiral or radial other than concentric. Further, for example, where a rectangular glass substrate for LCDs is treated as a target substrate, the microwave radiation holes 32 may be formed in linear patterns.

A wave-retardation body 33 having a dielectric constant larger than that of vacuum is disposed on the top of the planar antenna member 31. The wave-retardation body 33 shortens the wavelength of microwaves to adjust plasma, because the wavelength of microwaves becomes longer in a vacuum condition. The planar antenna member 31 may be set in contact with or separated from the transmission plate 28. Similarly, the wave-retardation body 33 may be set in contact with or separated from the planar antenna 31.

The planar antenna member 31 and wave-retardation body 33 are covered with a shield lid 34 located at the top of the chamber 1. The shield lid 34 is made of a metal material, such as aluminum or stainless steel, and serves as a wave guide tube. A seal member (described later) is interposed between the top of the chamber 1 and the shield lid 34 to seal this portion. The shield lid 34 is provided with cooling water passages 34a formed therein. Cooling water is supplied to flow through the cooling water passages 34a and thereby cool the shield lid 34, wave-retardation body 33, planar antenna member 31, and transmission plate 28. The shield lid 34 is grounded.

Figure 3:
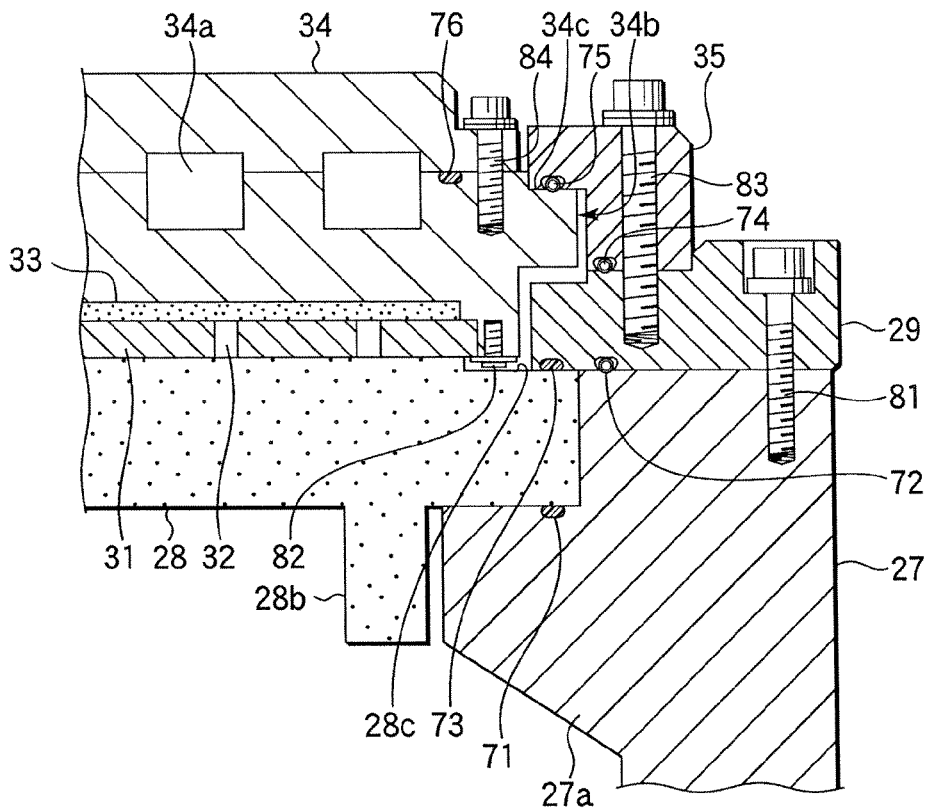
FIG. 3 is a sectional view showing a main portion of a joint structure on the upper side of a chamber.

FIG. 3 is a sectional view showing a main portion of the upper side of a chamber, i.e., the joint structure of the shield lid 34, wave-retardation body 33, planar antenna member 31, transmission plate 28, and upper plate 27. The transmission plate 28 is airtightly supported on the support portion 27a of the upper plate 27 through a seal member 71, such as an O-ring.

An annular presser member 29 is disposed to press the peripheral portion of the transmission plate 28 from above through a seal member 73, such as an O-ring. The presser member 29 is fixed to the upper plate 27 by fixing members 81, such as bolts, through a seal member 72. The seal member 72 is formed of, e.g., a spiral shield ring made of a metal and fitted in a groove formed in the presser member 29. Microwaves radiated from the microwave radiation holes 32 of the planar antenna member 31 are prevented by the seal member 72 from leaking outside through the transmission plate 28 and the interface between the upper plate 27 and presser member 29. This spiral shield ring is formed of, e.g., a spiral stainless steel body, so that it has a high shielding function against microwaves.

The planar antenna member 31 and wave-retardation body 33 are stacked in this order below the shield lid 34, and are fixed at the central portion by an inner conductive body 41 (see FIG. 1). The peripheral portion of the planar antenna member 31 is fixed to the shield lid 34 by fixing members 82, such as bolts, attached from below. The planar antenna member 31 is disposed on the transmission plate 28. The transmission plate 28 has an annular recess 28c in the periphery, and fixing members 82, such as bolts, are fitted therein.

The shield lid 34 has a projecting portion 34b extending outward in the radial direction at the periphery. The shield lid 34 is pressed from above the upper side 34c of the projecting portion 34b through a seal member 75, such as a spiral shield ring, by an annular presser member 35 having an L-shape in a cross section. The presser member 35 is fixed to the presser member 29 by fixing members 83, such as bolts. Consequently, the shield lid 34 and wave-retardation body 33 are fixed to each other. Seal members 74 and 75, such as spiral shield rings, are respectively interposed at the interfaces between the presser member 35 and presser member 29 and between the presser member 35 and shield lid 34 to prevent microwaves from leaking.

The shield lid 34 is formed of two separable parts respectively disposed on the upper and lower sides. These parts are joined and fixed by bolts 84 with a seal member 76, such as an O-ring, disposed to seal the interface such that cooling water passages 34a are formed therebetween.

With this joint structure on the upper side of the chamber 1, leakage of microwaves radiated from the planar antenna member 31 is suppressed. Consequently, it is possible to efficiently apply microwaves at a high output level while suppressing power loss, thereby performing a process with a high plasma density in a high vacuum state.

As shown in FIG. 1, the shield lid 34 has an opening portion 36 formed at the center of the upper wall and connected to a wave guide tube 37. The wave guide tube 37 is connected to a microwave generation unit 39 at one end through a matching circuit 38. The microwave generation unit 39 generates microwaves with a frequency of, e.g., 2.45 GHz, which are transmitted through the wave guide tube 37 to the planar antenna member 31. The microwaves may have a frequency of 8.35 GHz or 1.98 GHz.

The wave guide tube 37 includes a coaxial wave guide tube 37a having a circular cross-section and extending upward from the opening portion 36 of the shield member 34, and a rectangular wave guide tube 37b connected to the upper end of the coaxial wave guide tube 37a through a mode transducer 40 and extending in a horizontal direction. Microwaves are propagated in a TE mode through the rectangular wave guide tube 37b, and are then transduced into a TEM mode by the mode transducer 40 interposed between the rectangular wave guide tube 37b and coaxial wave guide tube 37a. The coaxial wave guide tube 37a includes an inner conductive body 41 extending at the center, which is connected and fixed to the center of the planar antenna member 31 at the lower end. Consequently, microwaves are efficiently propagated from the inner conductive body 41 of the coaxial wave guide tube 37a in the radial direction to the planar antenna member 31.

The respective components of the plasma oxidation processing apparatus 100 are connected to and controlled by a process controller 50 comprising a CPU. The process controller 50 is connected to a user interface 51 including, e.g. a keyboard and a display, wherein the keyboard is used for a process operator to input commands for operating the plasma oxidation processing apparatus 100, and the display is used for showing visualized images of the operational status of the plasma oxidation processing apparatus 100.

Further, the process controller 50 is connected to a storage section 52 that stores recipes containing control programs (software), process condition data, and so forth recorded therein, for the process controller 50 to control the plasma oxidation processing apparatus 100 so as to perform various processes.

A required recipe is retrieved from the storage section 52 and executed by the process controller 50 in accordance with an instruction or the like input through the user interface 51. Consequently, the plasma oxidation processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

Figure 4:
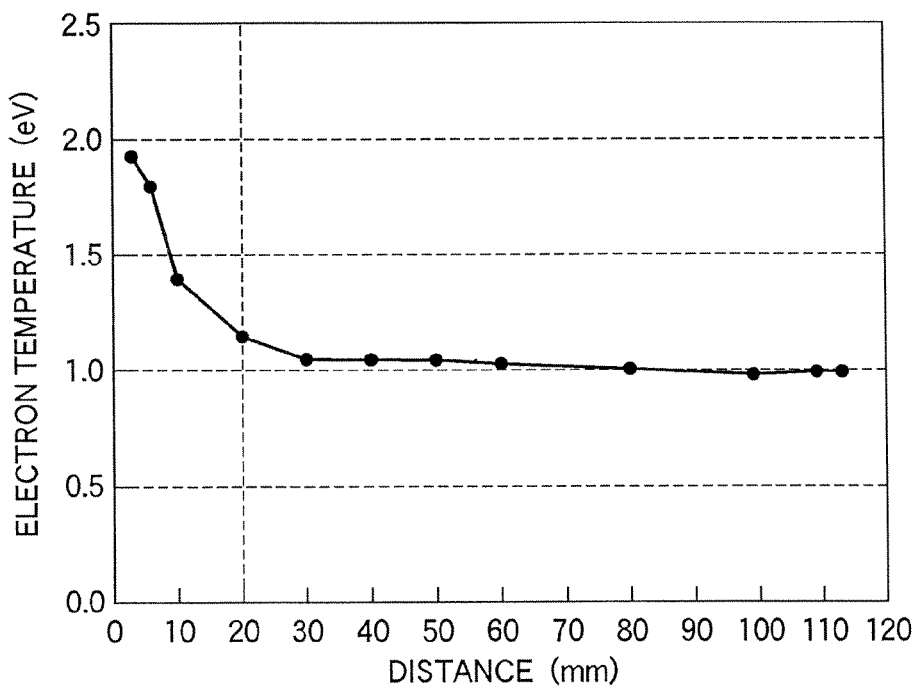
FIG. 4 is a graph showing the relationship between the distance from a top plate and the electron temperature of plasma.

In the plasma oxidation processing apparatus 100 according to this embodiment, the distance (gap G) between the wafer W placed on the worktable 2 and the transmission plate 28 facing the wafer W is set to be, e.g., 20 to 100 mm and preferably to be 20 to 80 mm. When plasma of a process gas is generated by microwaves supplied from the planar antenna member 31, it moves downward in the plasma processing space from a position in close vicinity to the transmission plate 28 toward the wafer W placed on the worktable 2. At this time, as shown in FIG. 4, the electron temperature of plasma is very high in a region close to the transmission plate 28, but is lowered to 1.2 [eV] or less and becomes stable at a position distant from the transmission plate 28 by about 20 mm or more. Accordingly, if the gap G is smaller than 20 mm, plasma having a high electron temperature (for example, plasma having an electron temperature of higher than 1.2 [eV]) may come to directly act on the wafer W and cause plasma damage on the wafer W.

On the other hand, where the gap G is larger than 80 mm, the thickness of the oxide film formed in a pattern including non-dense and dense portions on a wafer W tends to differ between the non-dense and dense portions. If the gap G exceeds 100 mm, the difference in thickness of the oxide film between the non-dense and dense portions goes beyond the permissible level. Further, in a pattern including different aspect ratios of trenches (the ratio of the depth of a trench relative to the width thereof) on a wafer, the thickness of the oxide film differs between the low aspect ratio and high aspect ratio portions. When such a non-dense and dense difference is caused, the film thickness becomes smaller at the dense portion or high aspect ratio portion as compared to the non-dense portion or low aspect ratio portion. Consequently, the performance of semiconductor devices is adversely affected, and the reliability thereof is deteriorated.

It is thought that a non-dense and dense difference is caused in a state where oxidizing species, such as oxygen ions and oxygen radicals, and oxidation assisting species, such as hydrogen ions and hydrogen radicals, contained in plasma cannot be sufficiently supplied near the bottom of pattern dense portions and/or high aspect ratio trenches. Particularly, hydrogen ions and hydrogen radicals serving as oxidation assisting species can be easily deactivated. Accordingly, if the gap G is too large, they are deactivated before reaching a position near the bottom of pattern dense portions and/or high aspect ratio trenches, and do not contribute to the oxidation reaction.

Further, with an increase in the gap G, the oxidation rate is gradually decreased. In light of this fact as well, the gap G is preferably set not to be too large.

Accordingly, in this embodiment, the gap G is set to be 100 mm or less, which is smaller than the conventional value of 130 to 150 mm, and is preferably set to be 80 mm or less. Consequently, supply of oxidizing species and assisting species described above is promoted, so the thickness of an oxide film becomes uniform irrespectively of non-dense and dense portions and/or aspect ratios of a pattern on a wafer W. Further, in this embodiment, since the worktable 2 is provided with the susceptor cover 2a, particle generation is sufficiently prevented, even where the gap G is set to be 20 to 100 mm, which is smaller than the conventional value of 130 to 150 mm, and is preferably set to be 20 to 80 mm.

In addition to the gap G being set to be 20 to 100 mm, and preferably to be 20 to 80 mm, the process pressure is preferably set to be 133.33 Pa or less, and more preferably to be 1.33 Pa to 66.66 Pa. With this arrangement, it is possible to attain a practically sufficient oxidation rate.

The effect obtained by setting the gap G preferably to be 20 to 80 mm works more prominently where the process pressure is a low value of about 1.33 to 66.66 Pa. The reason for this is as follows. Specifically, where the process pressure is a value of, e.g., 400 Pa higher than the range described above, the total number of oxidizing species and assisting species in plasma is large. In this case, the silicon oxidation reaction is in a state where the rate-determining factor is reaction, so a non-dense and dense difference can hardly appear. On the other hand, where the process pressure is a low value of 1.33 to 66.66 Pa, the silicon oxidation reaction is in a state where the rate-determining factor is supply. Accordingly, where the gap G is set to be 20 to 80 mm to increase supply of the oxidizing species and assisting species to the deep side (bottom) of pattern dense portions and/or high aspect ratio trenches, the effect of improving the non-dense and dense difference becomes prominent.

In the plasma oxidation processing apparatus 100 of the RLSA type thus arranged, a process may be performed to oxidize silicon (poly-crystalline silicon or single-crystalline silicon) on the surface of a wafer W to form a silicon oxide film. Next, an explanation will be given of such a process.

At first, the gate valve 26 is opened, and a wafer W having a silicon surface is transferred through the transfer port 25 into the chamber 1 and placed on the worktable 2. Then, Ar gas, $O_2$ gas, and $H_2$ gas are supplied at predetermined flow rates from the Ar gas supply source 17a, $O_2$ gas supply source 18a, and $H_2$ gas supply source 19a in the gas supply system 16a through the gas feed member 15 into the chamber 1.

More specifically, the flow rate of a rare gas, such as Ar, is set to be 500 to 2,000 mL/min (sccm), and the flow rate Of $O_2$ gas to be 5 to 200 mL/min (sccm), and further, as needed, the flow rate of $H_2$ gas to be 5 to 200 mL/min (sccm). In addition, the process pressure inside the chamber is set to be 1.33 Pa to 66.66 Pa (10 mTorr to 500 mTorr), and the wafer W is heated to a temperature of 200 to 800° C. and preferably of about 250 to 500° C.

Then, microwaves are supplied from the microwave generation unit 39 through the matching circuit 38 into the wave guide tube 37. The microwaves are propagated through the rectangular wave guide tube 37b, mode transducer 40, and coaxial wave guide tube 37a in this order and are supplied through the inner conductive body 41 to the planar antenna member 31. Then, the microwaves are radiated from the microwave radiation holes 32 of the planar antenna member 31 through the transmission plate 28 into the space above the wafer W within the chamber 1. The microwaves are propagated in a TE mode through the rectangular wave guide tube 37b, and are then transduced from the TE mode into a TEM mode by the mode transducer 40 and propagated in the TEM mode through the coaxial wave guide tube 37a to the planar antenna member 31. At this time, for example, the power of the microwaves may be set to be 1,000 to 4,000 W.

When the microwaves are radiated from the planar antenna member 31 through the transmission plate 28 into the chamber 1, an electromagnetic field is thereby formed inside the chamber 1 and excites Ar gas, $O_2$ gas, and $H_2$ gas into plasma. Since microwaves are radiated from a number of microwave radiation holes 32 of the planar antenna member 31, this oxygen-containing plasma has a high plasma density of about $1 \times 10^{10}$ to $5 \times 10^{12}/cm^3$ and a low electron temperature of about 1.2 eV or less near the wafer W. The microwave-excited plasma thus generated can cause less plasma damage due to ions and so forth. Radicals and mainly O radicals in the plasma serve to introduce oxygen into silicon, so that an $SiO_2$ film is uniformly formed on the silicon surface.

According to this embodiment, where a plasma process is performed in the plasma oxidation processing apparatus 100 to oxidize silicon (poly-crystalline silicon or single-crystalline silicon) by plasma to form a silicon oxide film, the gap G is set to be 20 to 100 mm, and preferably to be 20 to 80 mm. Consequently, a silicon oxide film is formed without causing a non-dense and dense difference in line and space patterns and/or trench patterns having different aspect ratios on a wafer W.

As described above, a high quality silicon oxide film is formed on the surface of single-crystalline silicon or poly-crystalline silicon. Accordingly, a plasma oxidation processing method according to this embodiment may be used for forming a silicon oxide film in various applications in the process of manufacturing various semiconductor devices. For example, the plasma oxidation processing apparatus 100 may be suitably used for the following applications. Specifically, one of them is oxidation of a poly-crystalline silicon layer on the sidewall of the gate electrode of a transistor. Another one is formation of an oxide film within a trench of the STI (Shallow Trench Isolation) type. Another one is oxidation of poly-crystalline silicon on the lower electrode of a capacitor. Another one is oxidation of the sidewall of a flash memory device.

Further, the following structures are examples of a gate electrode. Specifically, one example comprises a poly-crystalline silicon layer formed on a silicon wafer or Si substrate through a gate insulating film. Another example is a polycide structure which comprises a poly-crystalline silicon layer formed on an Si substrate through a gate insulating film, and a metal silicide layer, such as a tungsten silicide (WSi) layer, formed on the poly-crystalline silicon layer. Another example used for high speed devices is a metal gate structure or poly-metal gate structure with a lower resistivity which comprises a poly-crystalline silicon layer formed on an Si substrate through a gate insulating film, and a barrier layer of, e.g., tungsten nitride (WN) and a metal layer of, e.g., tungsten (W) sequentially formed on the poly-crystalline silicon layer.

Further, where a gate electrode containing a metal, such as tungsten (W), is treated, an oxidation process of poly-crystalline silicon may be performed with high density plasma while using a gas blending containing $H_2$ in the plasma oxidation processing apparatus 100. In this case, the process can be performed with very high accuracy, while sublimation of $WO_x$ ($WO_3$, $WO_2$, or WO) due to oxidation of tungsten (W) is suppressed as far as possible.

Figure 5:
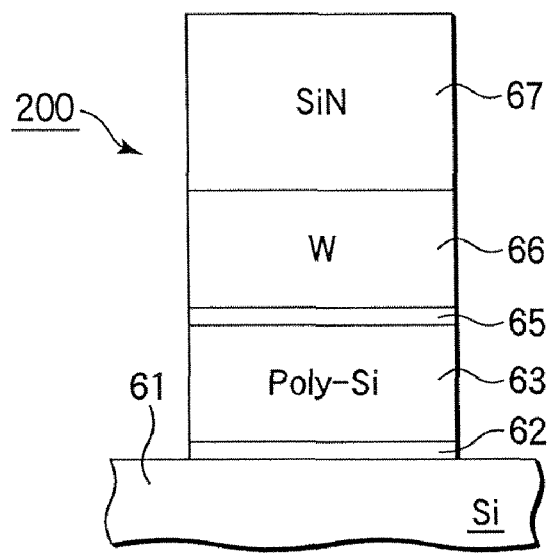
FIG. 5 is a view schematically showing a gate electrode before a plasma oxidation process.
Figure 6:
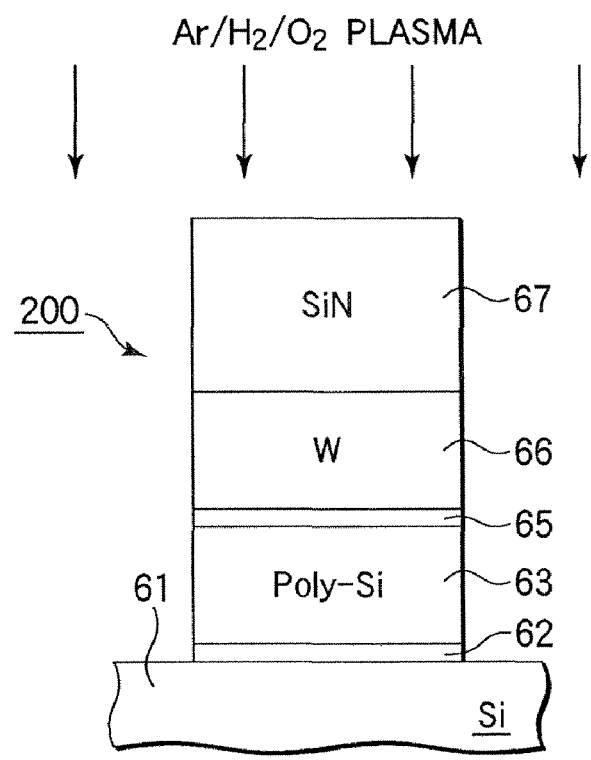
FIG. 6 is a view schematically showing the gate electrode during the plasma oxidation process.
Figure 7:
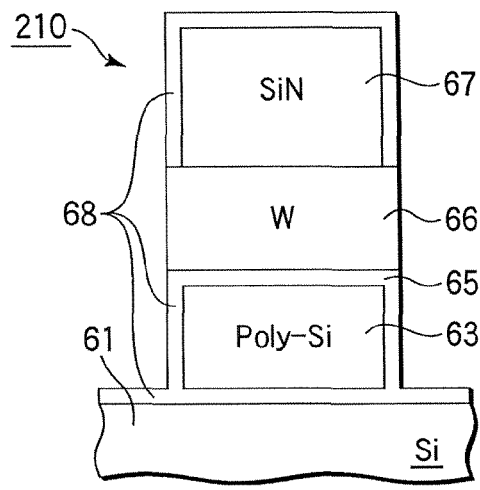
FIG. 7 is a view schematically showing the gate electrode after the plasma oxidation process.

Next, an explanation will be given of a process of manufacturing a semiconductor device by use of a method according to the present invention, with reference to the gate electrode of an MOS transistor used in semiconductor devices, such as DRAMs. FIGS. 5 to 7 are views schematically showing selective formation of an oxide film 68 on a gate electrode 200. FIG. 5 shows the gate electrode 200 after etching.

At first, in the process of fabricating the gate electrode, a $P^+$- or $N^+$-well region (diffusion region, (not shown)) doped with an impurity is formed in an Si substrate 61, and then a gate insulating film ($SiO_2$) 62 is formed by a thermal oxidation process or the like. Then, poly-crystalline silicon is deposited on the gate insulating film 62 by CVD to form a poly-crystalline silicon layer 63. Further, a tungsten layer 66 is formed from tungsten, which is a high-melting point electrode material, on the poly-crystalline silicon layer 63, to decrease the resistivity of the gate electrode 200 to improve the operation speed. The tungsten layer 66 may be formed by use of, e.g., a CVD method or sputtering method. In place of the tungsten layer 66, tungsten silicide (WSi) may be used. Before the tungsten layer 66 is formed, a very thin diffusion barrier layer 65 formed of, e.g., a nitride film (SiN film) is formed on the poly-crystalline silicon layer 63. The barrier layer 65 is used for preventing silicidation at the interface due to counter diffusion of W and Si, which brings about diffusion of WSi having a high resistivity. In this embodiment, the barrier layer 65 is made of tungsten nitride. The nitride film (SiN film) may be formed by supplying $NH_3$, $N_2$, or a mixture gas of $N_2$ and $H_2$ to nitride poly-crystalline silicon. In this case, a plasma nitridation process may be performed in a plasma nitridation processing apparatus 101 (see FIG. 10) according to an embodiment described later.

A hard mask layer 67 of silicon nitride and a photo-resist film (not shown) are formed in this order on the tungsten layer 66.

Thereafter, the hard mask layer 67 is etched by photolithography using the photo-resist film as a mask. Further, using the photo-resist film and hard mask layer 67 or the hard mask layer 67 as a mask, the tungsten layer 66, barrier layer 65, and poly-crystalline silicon layer 63 are sequentially etched to form the gate electrode 200. By this series of etching processes, sidewalls of the poly-crystalline silicon layer 63 and tungsten layer 66 are exposed on the side surface of the gate electrode 200. Further, a part of the gate insulating film 62 has been removed by etching, so a surface of the Si substrate 61 is exposed.

As shown in FIG. 6, the gate electrode 200 thus formed is then subjected to a plasma oxidation process in the plasma oxidation processing apparatus 100, while hydrogen gas and oxygen gas are controlled at a predetermined flow rate ratio. A this time, in order to preferentially oxidize poly-crystalline silicon while suppressing oxidation of tungsten, the flow rate ratio of $H_2$ relative to $O_2$ ($H_2/O_2$) is preferably set to be 1 or more, and more preferably to be 2 or more, such as 2 to 8.

The conditions of the plasma oxidation process are selected to improve uniformity of an oxide film formed on the surface of the wafer W, and particularly to decrease a difference in thickness of the oxide film on the sidewall of the poly-crystalline silicon layer 63 due to non-dense and dense portions of the gate pattern (non-dense and dense difference). In light of this, the gap G is set to be 20 to 100 mm, and preferably to be 20 to 80 mm.

Where the plasma oxidation process is performed under such conditions, an oxide film 68 is formed preferentially on a surface of the poly-crystalline silicon layer 63 and uniformly irrespectively of non-dense and dense portions of the gate pattern. On the other hand, no oxide film is formed on the sidewalls of the tungsten layer 66 and barrier layer 65. Consequently, the gate electrode 210 is changed to the state shown in FIG. 7. At this time, an oxide film is slightly formed on the Si substrate and SiN surface. Where the gate electrode includes another high-melting point material, such as one of molybdenum, tantalum, and titanium, and silicide, nitride, and alloy thereof, formed in place of the tungsten layer 66, the process may be performed in the same way.

Figure 8:
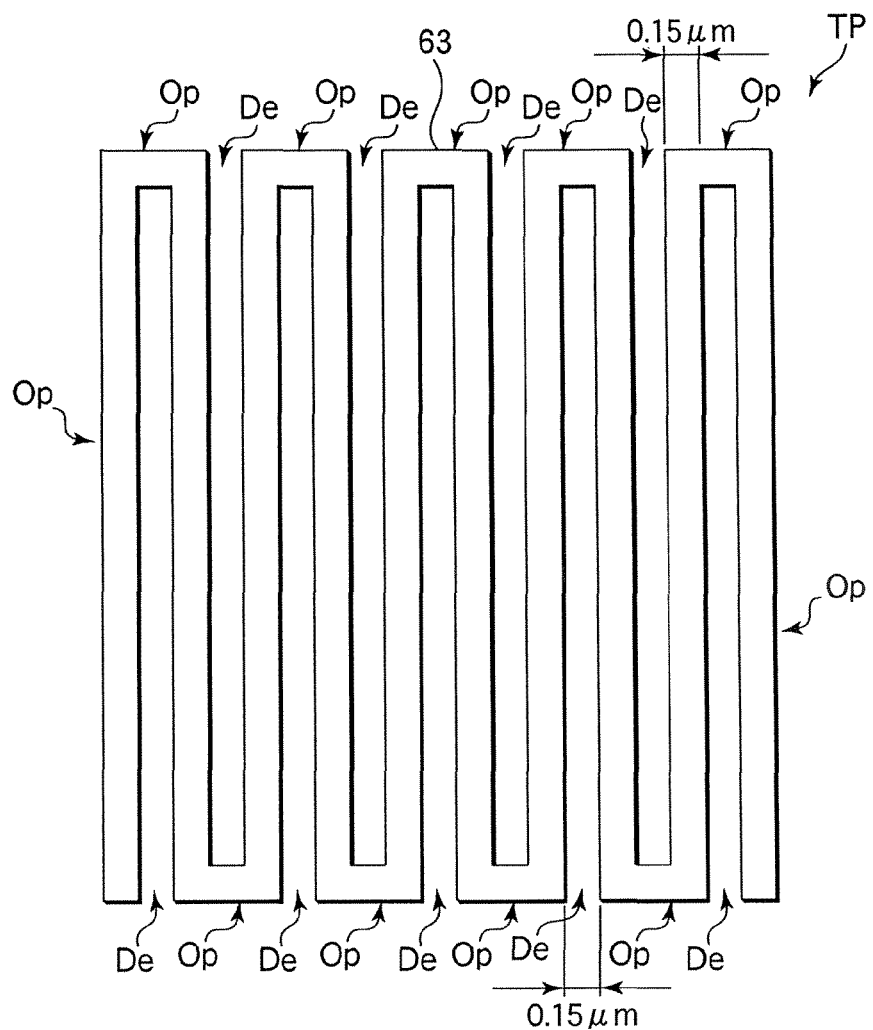
FIG. 8 is a view showing a test pattern used in obtaining experimental data on which the present invention was made.

Next, an explanation will be given of experimental data on which the present invention was made. By use of the plasma oxidation processing apparatus 100 shown in FIG. 1, a line and space test pattern TP shown in the plan view of FIG. 8 was formed. The width of a poly-crystalline silicon layer 63 (line) was set at 0.15 μm and the distance (space) between line portions was set at 0.15 μm. The plasma oxidation processing apparatus 100 shown in FIG. 1 was used with different values of the gap G to perform a process of oxidizing the sidewall of the poly-crystalline silicon layer 63 of this test pattern TP. The gap G was set at three values of 79 mm, 105 mm, and 134 mm.

In this plasma oxidation process, the flow rate of the process gas was set at $Ar/O_2/H_2$=1,000/10/10 mL/min (sccm), the process temperature (substrate process temperature) at 250° C., and the supply power to plasma at 3 kW. The process time was set to form a silicon oxide film having a thickness 6 nm on a bare silicon substrate surface. After the oxidation process, the thickness of the oxide film formed on the sidewall of the poly-crystalline silicon layer 63 was measured at open portions Op and dense portions De of the test pattern TP.

Figure 9:
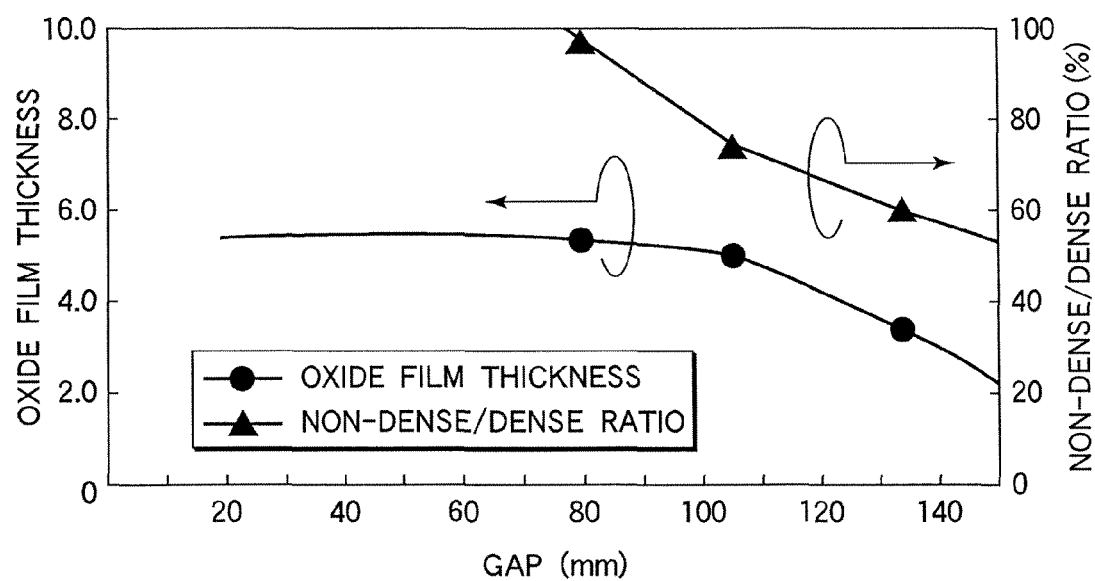
FIG. 9 is a graph showing the relationship of the gap relative to the oxide film thickness and dense/non-dense ratio.

FIG. 9 shows the thickness of the oxide film formed on the sidewall of the poly-crystalline silicon layer 63 by performing the oxidation process with the respective values of the gap G, and the thickness ratio of the oxide film between the open portions Op and the dense portions De of the test pattern TP (dense/non-dense ratio). In FIG. 9, the vertical axis denotes the dense/non-dense ratio (%), which is defined by a percentage of the thickness of the oxide film at the dense portions De relative to the thickness of the oxide film at the open portions Op. Where this value is closer to 100, the non-dense and dense difference is smaller, and thus a uniform oxide film has been formed.

As shown in FIG. 9, with a decrease in the gap G, the dense/non-dense ratio was increased. Where the gap G was 79 mm, the dense/non-dense ratio was very close to 100%, and thus the thickness of the oxide film on the sidewall was almost the same between the dense portions De and the open portions Op. From these results, it has been confirmed that, where the gap G is set to be 100 mm or less, and preferably to be 80 mm or less, the non-dense and dense difference is decreased so that the oxide film 68 is formed to have a uniform thickness. On the other hand, where the gap G was 105 mm or 134 mm, the dense/non-dense ratio was smaller, and thus the non-dense and dense difference was increased. Further, where the gap G was 79 mm or 105 mm, the oxidation rate was larger than that obtained by a case where the gap G was 134 mm. From these results, it has been confirmed that, where the gap G is set to be 100 mm or less, and preferably to be 80 mm or less, to perform a plasma oxidation process, not only the non-dense and dense difference is improved, but also a practically sufficient oxidation rate is obtained.

Figure 10:
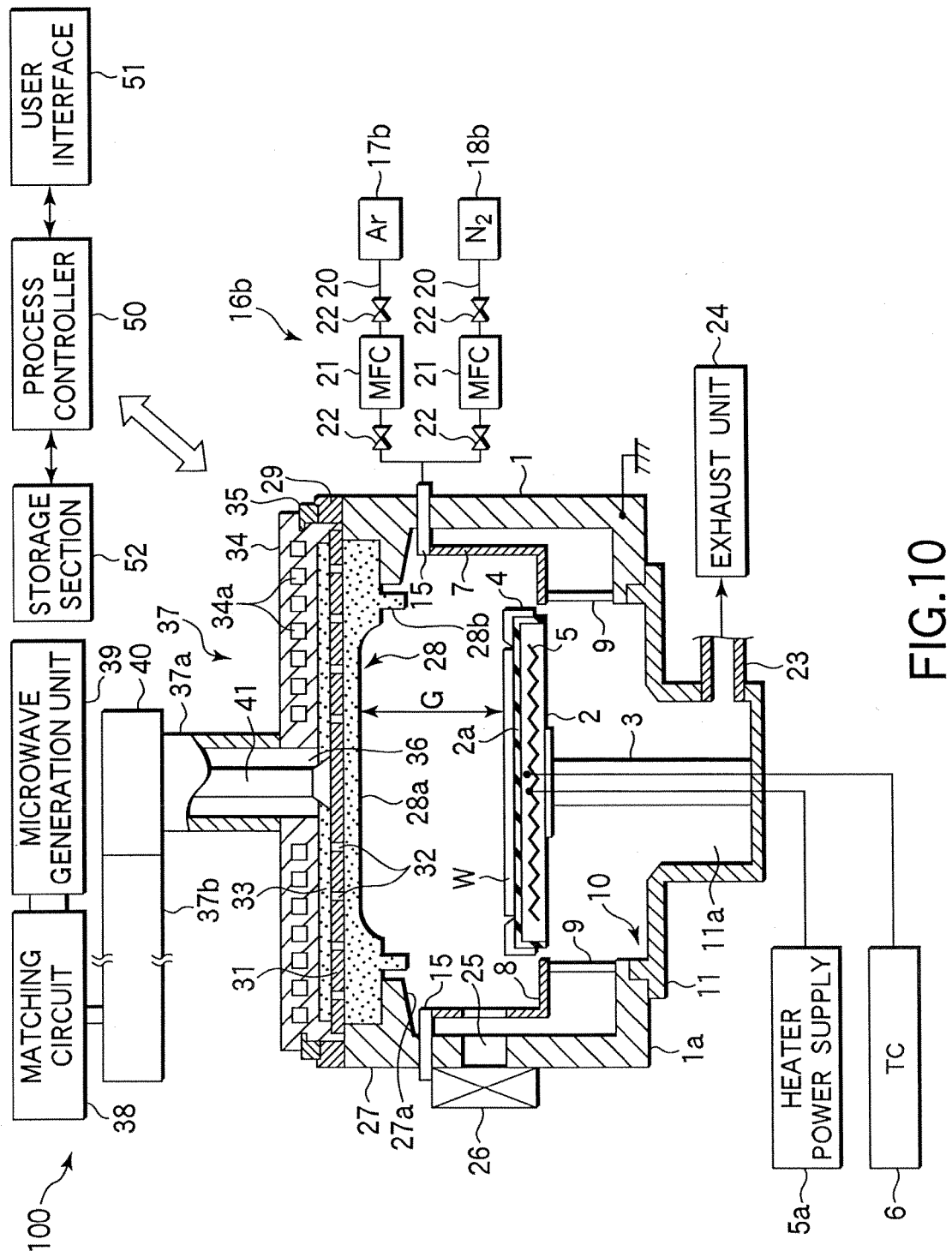
FIG. 10 is a sectional view schematically showing a plasma nitridation processing apparatus according to another embodiment of the present invention.

Next, an explanation will be given of another embodiment. FIG. 10 is a sectional view schematically showing an example of a plasma nitridation processing apparatus 101 suitable for performing a plasma nitridation processing method according to another embodiment of the present invention. This plasma nitridation processing apparatus 101 has the same structure as that of the plasma oxidation processing apparatus 100 shown in FIG. 1 except for the process gas supply system. Accordingly, the following explanation is focused on the difference therebetween, while the same elements are denoted by the same reference numerals, and description thereof will be omitted.

The plasma nitridation processing apparatus 101 has a gas supply system 16b, which includes an Ar gas supply source 17b and an $N_2$ gas supply source 18b, for example. Ar gas and $N_2$ gas from these sources are supplied through respective gas lines 20 to the gas feed member 15 and are delivered from the gas feed member 15 into the chamber 1. Each of the gas lines 20 is provided with a mass-flow controller 21 and two switching valves 22 one on either side of the controller 21. In the plasma nitridation processing apparatus 101, in place of Ar gas, another rare gas, such as Kr gas, Xe gas, or He gas, may be used. Further, in place of $N_2$ gas, $NH_3$ gas, a mixture gas of $N_2$ and $H_2$, or hydrazine may be used, for example.

In the plasma nitridation processing apparatus 101 according to this embodiment, the distance (gap G) between the wafer W placed on the worktable 2 and the transmission plate 28 facing the wafer W is set to be 20 to 100 mm and preferably to be 20 to 80 mm, in light of the same reason as in the embodiment described above. If the gap G is smaller than 20 mm, plasma having a high electron temperature, such as plasma having an electron temperature of higher than 1.2 eV, may come to directly act on the wafer W and cause plasma damage on the wafer W. If the gap G exceeds 100 mm, a difference in thickness of a nitride film tends to increase between the non-dense and dense portions of a pattern (non-dense and dense difference). Further, with an increase in the gap G, the nitridation rate is decreased; which is not preferable. On the other hand, where the gap G is set to be 100 mm or less, the dense/non-dense ratio can be about 80% or more, and the nitridation can be performed without decreasing the nitridation rate.

In the plasma nitridation processing apparatus 101 of the RLSA type thus arranged, a process may be performed to nitride silicon (poly-crystalline silicon or single-crystalline silicon) on the surface of a wafer W to form a silicon nitride film. Next, an explanation will be given of such a process.

At first, the gate valve 26 is opened, and a wafer W having a silicon surface is transferred through the transfer port 25 into the chamber 1 and placed on the worktable 2. Then, Ar gas and $N_2$ gas are supplied at predetermined flow rates from the Ar gas supply source 17b and $N_2$ gas supply source 18b in the gas supply system 16b through the gas feed member 15 into the chamber 1.

More specifically, the flow rate of a rare gas, such as Ar, is set to be 500 to 2,000 mL/min (sccm), and the flow rate of $N_2$ gas to be 5 to 200 mL/min. In addition, the process pressure inside the chamber is set to be 1.33 Pa to 133.3 Pa (10 mTorr to 1,000 mTorr), and the wafer W is heated to a temperature of 200 to 800° C. and preferably of about 250 to 500° C.

Then, microwaves are supplied from the microwave generation unit 39 through the matching circuit 38 into the wave guide tube 37. The microwaves are propagated through the rectangular wave guide tube 37b, mode transducer 40, and coaxial wave guide tube 37a in this order and are supplied through the inner conductive body 41 to the planar antenna member 31. Then, the microwaves are radiated from the microwave radiation holes 32 of the planar antenna member 31 through the transmission plate 28 into the space above the wafer W within the chamber 1. The microwaves are propagated in a TE mode through the rectangular wave guide tube 37b, and are then transduced from the TE mode into a TEM mode by the mode transducer 40 and propagated in the TEM mode through the coaxial wave guide tube 37a to the planar antenna member 31. At this time, for example, the power of the microwaves may be set to be 1,000 to 4,000 W.

When the microwaves are radiated from the planar antenna member 31 through the transmission plate 28 into the chamber 1, an electromagnetic field is thereby formed inside the chamber 1 and excites Ar gas and $N_2$ gas into plasma. Since microwaves are radiated from a number of microwave radiation holes 32 of the planar antenna member 31, this nitrogen-containing plasma has a high plasma density of about $1 \times 10^{10}$ to $5 \times 10^{12}/cm^3$ and a low electron temperature of about 1.2 eV or less near the wafer W. The microwave-excited plasma thus generated can cause less plasma damage due to ions and so forth. Radicals and mainly N radicals in the plasma serve to introduce nitrogen into silicon, so that a silicon nitride film ($Si_3N_4$ film) is uniformly formed on the silicon surface.

According to this embodiment, where a plasma process is performed in the plasma nitridation processing apparatus 101 to nitride silicon (poly-crystalline silicon or single-crystalline silicon) by plasma to form a silicon nitride film, the gap G is set to be 20 to 100 mm, and preferably to be 20 to 80 mm. Consequently, a silicon nitride film is formed without causing a non-dense and dense difference in line and space patterns and/or trench patterns having different aspect ratios on a wafer W, as in the plasma oxidation process described above.

As described above, a high quality silicon nitride film is formed on the surface of single-crystalline silicon or poly-crystalline silicon. Accordingly, a plasma nitridation processing method according to this embodiment may be used for performing a silicon nitridation process in various applications in the process of manufacturing various semiconductor devices. For example, a plasma nitridation processing method according to this embodiment may be suitably used for the following applications. Specifically, one of them is formation of a nitride film on a poly-crystalline silicon layer on the sidewall of the gate electrode of a transistor. Another one is formation of a nitride film on the sidewall of a gate sidewall spacer (TEOS). Another one is formation of a nitride film within a trench of the STI type.

The present invention is not limited to the embodiments described above, and it may be modified in various manners.

For example, in the embodiments described above, an oxidation process or nitridation process is performed on a semiconductor wafer, particularly a silicon wafer, treated as a target substrate. As a semiconductor wafer, a compound semiconductor wafer may be treated in place of a silicon wafer. Further, the target substrate is not limited to a semiconductor wafer, and it may be another substrate, such as a glass substrate for flat panel display devices (FPD), a representative of which is a liquid crystal display device (LCD).

What is claimed is:

1. A plasma processing apparatus comprising:
   a process container configured to hold a vacuum therein and perform a plasma process on a target object accommodated therein, the process container including a container casing that is equipped with an upper plate disposed on an upper side thereof and defining a top opening, and a dielectric transmission plate supported by the upper plate and airtightly closing the top opening;
   a worktable configured to place the target object thereon inside the process container;
   a planar antenna disposed above the transmission plate and including a plurality of slots to supply microwaves from the slots through the transmission plate into the process container;
   a gas feed member configured to supply a process gas, to be turned into plasma by the microwaves, into the process container;
   an exhaust line configured to exhaust gas from inside the process container;
   a dielectric wave-retardation body disposed above the planar antenna and configured to shorten a wavelength of the microwaves; and
   a metal cover covering the planar antenna and the wave-retardation body,
   wherein the planar antenna is fixed at a periphery of the planar antenna to the metal cover by fixing members, which are fitted in a recess formed on the transmission plate at a periphery of the transmission plate, and
   the transmission plate is set at a position where the transmission plate is separated from the target object placed on the worktable by a distance of from 20 mm to 100 mm.

2. The plasma processing apparatus according to claim 1, wherein the recess is formed as an annular recess on the transmission plate at a periphery of the transmission plate.

3. The plasma processing apparatus according to claim 1, wherein the transmission plate includes a dished recess formed on a lower surface facing the target object, and the distance is defined by a distance between the target object and a thin portion of the transmission plate corresponding to the dished recess.

4. The plasma processing apparatus according to claim 3, wherein the thin portion of the transmission plate has a thickness of $\lambda g/4$ or more, where $\lambda g$ is the wavelength of the microwaves.

5. A plasma processing apparatus comprising:
   a process container configured to hold a vacuum therein and perform a plasma process on a target object accommodated therein, the process container including a container casing that is equipped with an upper plate disposed on an upper side thereof and defining a top opening, and a dielectric transmission plate supported by the upper plate and airtightly closing the top opening through a first seal member;
   a worktable configured to place the target object thereon inside the process container;
   a planar antenna disposed above the transmission plate and including a plurality of slots to supply microwaves from the slots through the transmission plate into the process container;

a gas feed member configured to supply a process gas, to be turned into plasma by the microwaves, into the process container;

an exhaust line configured to exhaust gas from inside the process container;

a dielectric wave-retardation body disposed above the planar antenna and configured to shorten a wavelength of the microwaves;

a metal cover covering the planar antenna and the wave-retardation body;

a first presser member that presses the transmission plate to the upper plate via a first fixing member, the first presser member being set in contact with the transmission plate at a periphery of the transmission plate with a second seal member interposed between the first presser member and the periphery of the transmission plate, and the first presser member being in contact with a top portion of the upper plate with a third seal member of a metal seal ring interposed between the first presser member and the top portion of the upper plate; and a second presser member that presses the metal cover to the first presser member via a second fixing member, the second presser member being set in contact with the metal cover at a periphery of the metal cover with a fourth seal member of a metal seal ring interposed between the second presser member and the periphery of the metal cover, and the second presser member being in contact with the first presser member with a fifth seal member of a metal seal ring interposed between the second presser member and the first presser member, wherein the transmission plate is set at a position where the transmission plate is separated from the target object placed on the worktable by a distance of from 20 mm to 100 mm.

6. The plasma processing apparatus according to claim 5, wherein the planar antenna is fixed at a periphery of the planar antenna to the metal cover by fixing members, which are fitted in a recess formed on the transmission plate at a periphery of the transmission plate.

7. The plasma processing apparatus according to claim 6, wherein the recess is formed as an annular recess on the transmission plate at a periphery of the transmission plate.

8. The plasma processing apparatus according to claim 5, wherein the transmission plate includes a dished recess formed on a lower surface facing the target object, and the distance is defined by a distance between the target object and a thin portion of the transmission plate corresponding to the dished recess.

9. The plasma processing apparatus according to claim 8, wherein the thin portion of the transmission plate has a thickness of $\lambda g/4$ or more, where $\lambda g$ is the wavelength of the microwaves.

* * * * *